United States Patent [19]

Chan

[11] Patent Number: 5,401,665
[45] Date of Patent: Mar. 28, 1995

[54] METHOD OF FABRICATING A FIELD-EFFECT TRANSISTOR OVER GATE ELECTRODE

[75] Inventor: Winston K. Chan, Fair Haven, N.J.

[73] Assignee: Bell Communications Research, Inc., Livingston, N.J.

[21] Appl. No.: 177,506

[22] Filed: Jan. 5, 1994

Related U.S. Application Data

[62] Division of Ser. No. 916,535, Jul. 20, 1992, Pat. No. 5,302,842.

[51] Int. Cl.[6] .......................................... H01L 21/265
[52] U.S. Cl. ........................................ 437/40; 437/22; 437/86; 437/912; 437/913; 148/DIG. 12; 148/DIG. 150
[58] Field of Search .................. 437/40, 912, 911, 974, 437/22, 915, 184, 86; 148/DIG. 150, DIG. 12, DIG. 159, DIG. 53

[56] References Cited

U.S. PATENT DOCUMENTS

| | | |
|---|---|---|
| 4,193,836 | 3/1980 | Youmans et al. . |
| 4,317,125 | 2/1982 | Hughes et al. . |
| 4,534,103 | 8/1985 | Cho et al. ........................ 437/912 |
| 4,612,083 | 9/1986 | Yasumoto et al. ......... 148/DIG. 164 |
| 4,784,970 | 11/1988 | Solomon ............................ 437/90 |
| 4,846,931 | 7/1989 | Gmitter et al. . |
| 4,971,925 | 11/1990 | Alexander et al. ........ 148/DIG. 135 |
| 5,091,331 | 2/1992 | Delgado et al. .................... 437/974 |
| 5,122,852 | 6/1992 | Chan et al. . |

FOREIGN PATENT DOCUMENTS

| | | |
|---|---|---|
| 58-46681 | 3/1983 | Japan . |
| 60-68661 | 4/1985 | Japan . |
| 63-65676 | 3/1988 | Japan . |
| 63-209179 | 8/1988 | Japan . |
| 1-82676 | 3/1989 | Japan . |
| 1-241178 | 9/1989 | Japan . |
| 2-177435 | 7/1990 | Japan ....................... 148/DIG. 135 |

OTHER PUBLICATIONS

J. C. Vokes et al., "Novel Microwave GaAs Field-Effect Transistors," *Electronics Letters*, 1979, vol. 15, pp. 627–629, Vokes et al.

E. Yablonovitch et al., "Van der Waals bonding of GaAs epitaxial liftoff films onto arbitrary substrates," *Applied Physics Letters*, 1990, vol. 56, pp. 2419–2421.

W. K. Chan et al., "Grafted Semiconductor Optoelectronics," *IEEE Journal of Quantum Electronics*, 1991, vol. 27, pp. 717–725.

*Journal of Applied Physics*, vol. 46, No. 7, Jul. 1975, "Ferroelectric Field-effect memory device using $Bi_4Ti_3O_{12}$ film", by Sugibuchi et al, pp. 2877–2882.

*Primary Examiner*—Brian E. Hearn
*Assistant Examiner*—Michael Trinh
*Attorney, Agent, or Firm*—Leonard Charles Suchyta; James W. Falk

[57] ABSTRACT

A field-effect transistor in which a metal gate (14) is defined on top of an insulating substrate (12). A freestanding semiconductor thin film (16), obtained by the epitaxial lift-off process, is bonded to both the top of the metal gate and the insulating substrate. Electrodes (20, 22) attached to the top of ends of the semiconductor film complete the transistor.

9 Claims, 3 Drawing Sheets

METHOD OF FABRICATING A FIELD-EFFECT TRANSISTOR OVER GATE ELECTRODE

GOVERNMENT INTEREST

This invention was made with Government support under Contract N00014-90-C-0048 awarded by the Department of the Navy. The Government has certain rights in the invention.

This is a division of application Ser. No. 07/916,535, filed Jul. 20, 1992, now U.S. Pat. No. 5,302,842, issued Apr. 12, 1994.

FIELD OF THE INVENTION

The invention relates generally to semiconductor transistors. In particular, the invention relates to a field-effect transistor having a gate formed below the semiconductor channel it is controlling.

BACKGROUND ART

The metal-semiconductor field-effect transistor is the product of a well developed and widely used technology. In its simplest form, a channel is formed in a surface region of a semiconductor, usually silicon. In a depletion-mode (normally on) FET, the channel is doped to be highly conductive. Source and drain electrodes are formed on opposite ends of the channel, and a metallic gate electrode is formed in the middle. The channel between the source and drain acts as the principal current path for majority semiconductor carriers. The junction between the metal gate and the semiconductor channel forms a Schottky barrier so that little current flows between the gate and the channel as long as the Schottky barrier remains reversed bias, for example, when the gate electrode is biased positively with respect to a p-type channel. Increasing reverse bias causes the depletion layer in the semiconductor to enlarge. Majority carriers are excluded from the depletion layer. If a sufficiently high reverse-bias voltage is applied to the gate to deplete the entire depth of the channel, the channel is pinched off so that the principal current path no longer conducts. If the channel is only partially depleted, the conductivity of the channel is proportionately reduced. Thereby, the gate voltage is used to either gate or modulate the source-drain current.

MESFETs and other FETs offer many advantages such as high-speed and low-power operation, but they suffer some disadvantages. Both p-channel and n-channel FETs are needed for complementary circuits, which dissipate very low power. However, the mobility of p-type channels is somewhat poor. In conventional MESFETs, pinch-off occurs as the depletion region meets the interface between high and low doping. Because such an interface is seldom abrupt, the electrical characteristics near pinch-off tend to be complex. Some attempts have been made to fabricate MESFETs with a dual gate, one above the channel and the other below so that pinch-off occurs in the middle of the channel. See, for example, "Novel Microwave GaAs Field-Effect Transistors," *Electronic Letters*, volume 15, 1979, pp. 627–629 by Vokes et al. However, such prior-art structures have been unduly cumbersome. It is also desirable to integrate a MESFET of a III–V compound semiconductor with a silicon integrated circuit.

SUMMARY OF THE INVENTION

The invention may be summarized as a field-effect transistor in which a narrow gate electrode, preferably of metal, is formed on an insulating substrate. A thin, free-standing semiconductor film is then applied to the metal and to the substrate. Such a film can be obtained by epitaxial lift-off. The film bonds in a bent shape to both the metal and the substrate. The bonding can utilize van der Waals force alone. Source and drain contacts are applied to the top of the film on either side of the bump formed by the buried gate electrode.

DETAILED DESCRIPTION OF THE PREFERRED EMBODIMENTS

Figure 1:
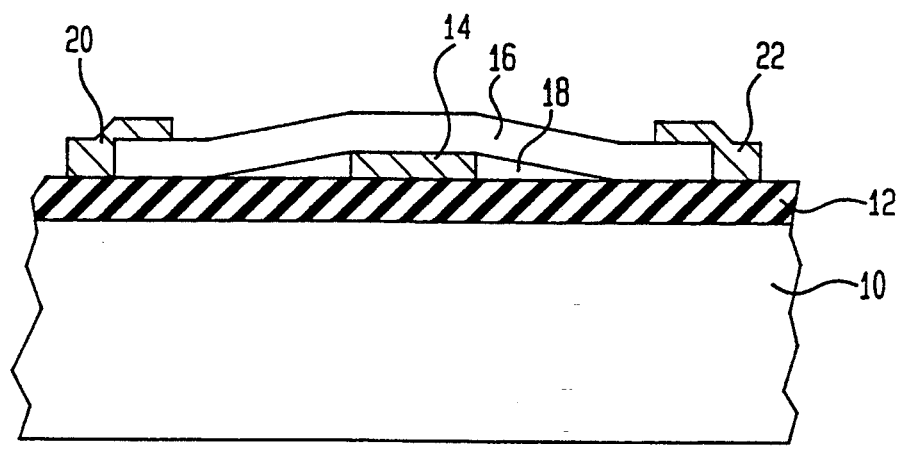
FIG. 1 is a cross-sectional view of a first embodiment of the invention.

A first embodiment of the invention is illustrated in FIG. 1. A surface of a singly crystalline silicon substrate 10 is oxidized to form an insulating $SiO_2$ layer 12. A metal layer is deposited on the $SiO_2$ layer 12 to a thickness of a few tens of nanometers and patterned to form a gate electrode 14 having a gate length of, for example, 1 $\mu$m. A very thin, freely standing semiconductor film 16 is bonded to the top of the gate electrode 14 and to surface portions of the $SiO_2$ layer 12 separated from the gate electrode 14 by lacunae 18 over which the semiconductor film 16 hangs suspended. The width of the bonded film 16 should be no longer than the unillustrated width of the gate electrode 14 although the film 16 may be patterned to this width after bonding. Metallic source and drain contacts 20 and 22 are deposited and patterned over the bonded film 16 and extend close to the gate electrode 14 so as to minimize resistance. Unillustrated bonding wires or interconnect metal lines attached to the gate electrode 14 and the source and drain contacts 20 and 22 provide the electrical signals to the inverted-gate MESFET.

The invention can utilize epitaxial-liftoff processing to bond a free-standing semiconductor film to a narrow conducting gate already formed on a substrate. Epitaxial liftoff is a two-step process by which a very thin semiconductor film is bonded to a substrate of nearly arbitrary composition. The epitaxial-liftoff process has been disclosed by Gmitter et al. in U.S. Pat. No. 4,846,931, by Yablonovitch et al. in "Van der Waals bonding of GaAs epitaxial liftoff films onto arbitrary substrates," *Applied Physics Letters*, volume 56, 1990, pp. 2419–2421, and by Chan et al. in U.S. Pat. No. 5,122,852 and in "Grafted Semiconductor Optoelectronics", *IEEE Journal of Quantum Electronics*, volume 27, 1991, pp. 717–725.

In the first step of the process, a free-standing, very thin semiconductor film is formed by growing the desired film of $Al_xGa_{1-x}As$ with $x<0.28$ on a release layer of AlAs. The structure is then etched in HF, which preferentially etches the AlAs and thereby releases the thin film from its substrate. In the second step of the process, the film is bonded to a nearly arbitrary substrate. Often van der Waals forces are sufficient to bond the atomically smooth film to a smooth substrate.

The semiconductor thin film 16 bonded to both the gate electrode 14, and the $SiO_2$ layer 12 has a crystalline orientation different than and indeed unrelated to either of them. Indeed, they all have different crystalline structures since the semiconductor thin film 16 is singly crystalline, the metallic gate electrode 14 is polycrystalline, and the $SiO_2$ layer 12 is amorphous.

EXAMPLE 1

A MESFET of FIG. 1 was fabricated and tested. A silicon wafer was thermally oxidized to a thickness of 1.2 μm to form the $SiO_2$ layer 12. The gate metal of 10 nm of Ti followed by 30 nm of Pt was e-beam evaporated and then patterned to form a gate portion of the gate electrode 14 having a 1 μm length and a 140 μm width. A tab portion of the gate electrode 14 extended beyond the end of the gate portion to allow bonding to the gate electrode 14.

The thin film 16 was epitaxially grown by organometallic chemical vapor deposition. A release layer of 50 nm of AlAs was grown on a (001)-oriented substrate of GaAs. The thin film 16 of GaAs was grown on the release layer to a thickness of 300 nm. It was uniformly doped n-type to $2 \times 10^{17}$ cm$^{-3}$ with silicon. Using standard epitaxial-liftoff processing, the thin film 16 was released from the GaAs substrate and bonded to the silicon wafer. The film 16 was positioned to overlie the gate electrode 14 and to have a {110} edge extending parallel to the long direction of the gate electrode 14.

The thin film 16 was chemically patterned to the desired length and width. In particular, its width was no wider than that of the linear gate portion of the gate electrode 14, and the tab portion of the gate electrode 14 was uncovered. The source and drain contacts 20 and 22 were standard ohmic contacts of AuGeNi deposited by electron-beam evaporation, patterned by lift-off, and alloyed at 420° C. for 20 seconds. The spacing between the source and drain contacts 20 and 22 was 5 μm.

The device was then electrically tested. The current-voltage characteristic of the gate showed that the GaAs film 16 forms a Schottky barrier with the underlying metal gate 14. The gate could modulate the drain current from a saturated drain current $I_{dss}$ of 120 mA/mm to pinch-off at a pinch-off voltage of $-3.5$ V and with a maximum extrinsic transconductance $g_m$ of 40 mS/mm. For comparison, a MESFET with a front-surface gate was fabricated on the GaAs growth wafer, and it showed a value for $g_m$ of 50 mS/mm.

The portion of the invention described above has been disclosed by Chan et al. in "Inverted Gate GaAs MESFET by epitaxial liftoff," *Electronics Letters*, volume 28, 1992, pp. 708–709.

There are several possible variations and improvements.

Figure 2:
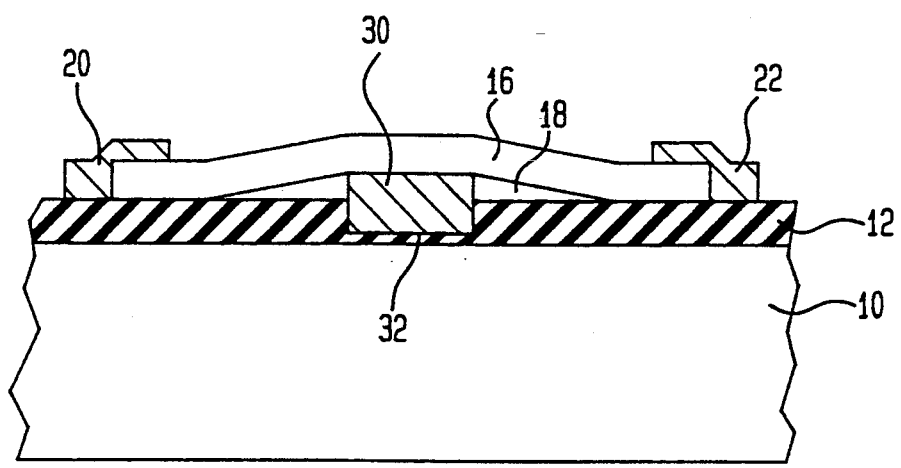
FIG. 2 is a cross-sectional view of a second embodiment of the invention having a gate depressed into the substrate.

The very thin gate electrode 14 of FIG. 1 prevents excessive bending or cantilevering of the thin film 16, but its thinness may cause excessive resistance. As illustrated in FIG. 2, a thicker gate electrode 30 is deposited into a recess 32 formed in the $SiO_2$ layer 12 so that only a portion of the gate electrode 30 extends above the surface. A single masking step can be used to etch the recess and to deposit the gate metal with the excess gate metal being lifted off.

Figure 3:
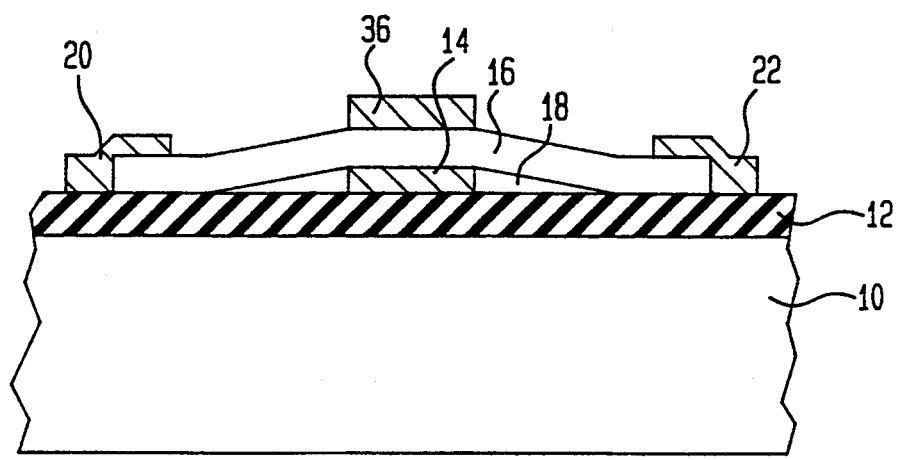
FIG. 3 is a cross-sectional view of a third embodiment of the invention having a dual gate.

A dual-gate MESFET, illustrated in FIG. 3, has a second gate electrode 36 deposited on top of the semiconductor film 16. The gate metal needs to form a Schottky barrier with the semiconductor while the contact metal should form an ohmic contact. The upper gate electrode 36 can be electrically connected to the lower gate electrode 14 or be separately controlled.

Figure 4:
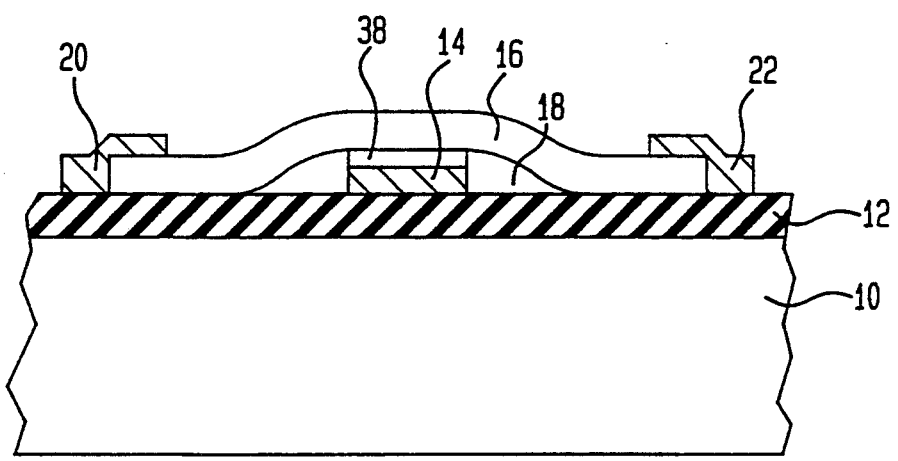
FIG. 4 is a cross-sectional view of a fourth embodiment of the invention having a ferroelectric layer to provide memory for the gate.

A memory MESFET illustrated in FIG. 4 has a non-volatile memory function for its gate. A ferroelectric layer 38 is deposited over the gate electrode 14 and photolithographically defined with it. The semiconductor thin film 16 is bonded to the top of the ferroelectric layer 38. The bonding of the semiconductor to the ferroelectric avoids processing incompatibilities between the two types of materials. In operation, the ferroelectric layer 38 is poled into one polarization state by applying a reverse biasing voltage pulse between the gate electrode 14 and the thin film 16. When the biasing voltage pulse ends, the ferroelectric layer 38 remains in the same polarization state and exerts nearly the same electrical field on the thin film 16 as in the presence of the biasing voltage pulse. Thereby, the gate can be pinched off or put into some intermediate state by momentary poling by the gate electrode 14. After removal of the biasing voltage, the gate remains pinched off. To change the gate back to the original state, a forward bias pulse is applied to the gate electrode 14. Similar effects are utilized for non-volatile ferroelectric memories having electrodes sandwiching the ferroelectric.

Figure 5:
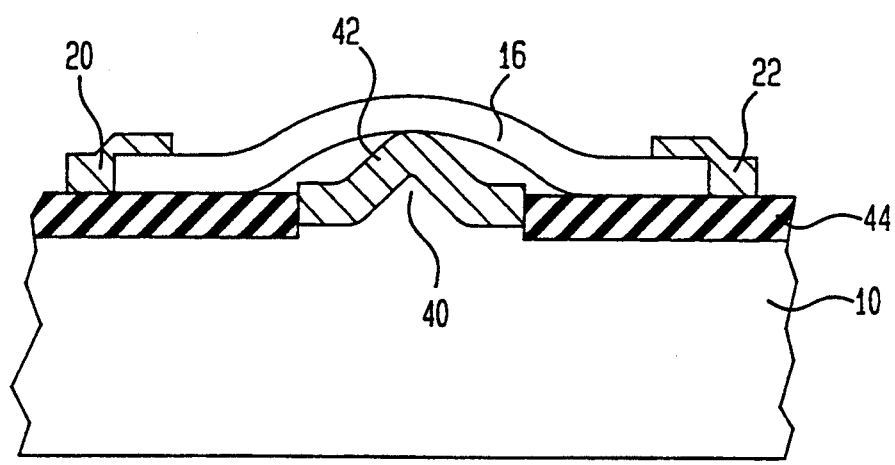
FIG. 5 is a cross-sectional view of a fifth embodiment of the invention having a very short gate length.

Another embodiment of the invention illustrated in FIG. 5 has an extremely short gate length, of the order of tens of nanometers, but does not require sophisticated lithography. A wedge 40 is formed in the silicon substrate 10 by, for example, photolithographically defining a relatively wide rib along the (110) direction in the surface of a (001)-oriented substrate and etching with a highly anisotropic etchant that etches (111)-oriented surfaces significantly more slowly than it etches the (001)-oriented substrate surface. The wedge is then coated with a metal layer which is defined as a gate electrode 42 having a relatively sharp ridge tip. The exposed silicon is then oxidized to form an $SiO_2$ layer 44. When the semiconductor thin film 16 is bonded to the surface, it contacts only the tip of the gate electrode 42. The length of contact between the thin film 16 and the tip of the gate electrode 42 is very short. This length defines the gate length, and the gate resistance is relatively low for the short gate length. The sharp curvature of the film 16 at the tip significantly stresses the semiconductor film 16. Thereby, the degeneracy between the light holes and heavy holes is lifted, allowing higher mobility in p-type GaAs.

The invention is not limited to the described embodiments but includes other semiconductor materials, such as silicon, other types of MESFETs and other types of FETs, such as junction FETs. The semiconductor thin film may be obtained by methods other than epitaxial lift-off, such as by etching away the entire growth substrate. The semiconductor film may be bonded by means other than or in addition to van der Waals forces.

I claim:

1. A method of fabricating a transistor comprising the steps of forming a conducting body on an upper surface of an insulating substrate so as to extend at least in part above the upper surface of the insulating substrate, forming a free-standing semiconductor film, and bonding said semiconductor film to an upper surface of the conducting body and to two portions of the upper surface of the insulating substrate on opposing lateral sides of the conducting body.

2. A method of fabricating a transistor comprising the steps of forming a conducting body on an upper surface of an insulating substrate so as to extend at least in part above the upper surface of the insulating substrate, forming a free-standing semiconductor film, bending said semiconductor film, and bonding said semiconductor film to an upper surface of the conducting body and to two portions of the upper surface of the insulating substrate on opposing later sides of the conducting body, so that said film is stressed by the conducting body above the upper surface of the insulating substrate.

3. The method in accordance with claim 2 further comprising attaching electrical contacts to opposite ends of said thin film with respect to said conducting body.

4. A method of fabricating a transistor comprising the steps of forming a conducting body on an upper surface of an insulating substrate so as to extend at least in part above the upper surface of the insulating substrate, forming a free-standing thin semiconductor film, and bonding said thin semiconductor film to said conducting body and to two portions of the upper surface of the insulating substrate so as to form lacunae between said conducting body and said portions and over which lacunae said thin film semiconductor film hangs suspended.

5. The method in accordance with claim 4 wherein said bonding step includes providing a bent shape to said thin semiconductor film so that said thin semiconductor film is stressed by said conducting body above said upper surface of said insulating substrate.

6. A method of fabricating a transistor comprising the steps of forming a conducting body on a surface of an insulating substrate, growing a semiconducting thin film on a crystalline substrate, freeing said semiconducting thin film from said crystalline substrate so as to provide a free-standing semiconducting thin film, and bonding the free-standing semiconducting thin film so provided to an upper surface of said conducting body and to two regions of said surface of said insulating substrate on opposing sides of said conducting body.

7. A method of forming a transistor comprising the steps of forming a conducting body on an upper surface of an insulating substrate, said conducting body extending in a first direction along said substrate and extending upwardly at least in part above said upper surface, forming a free standing semiconductor film, and bonding said semiconductor thin film to an upper surface of said conducting body and to two portions of said upper surface of said insulating substrate on opposing lateral sides of said conducting body, said thin film extending from said two portions over said upper surface of said insulating body without touching said upper surface of said insulating body whereby lacunae are formed between said conducting body and said portions and over which lacunae said thin film hangs suspended.

8. The method in accordance with claim 7 wherein said insulating substrate includes a recess in said upper surface thereof and said step of forming said conducting body includes positioning said conducting body in said recess.

9. The method in accordance with claim 7 wherein said conducting body comprises a crystalline substrate having a wedge and said step of forming said conducting body includes forming a conductive coating over a top and sides of said wedge.

* * * * *